United States Patent
Doherty et al.

(10) Patent No.: US 6,567,277 B1
(45) Date of Patent: May 20, 2003

(54) AC ADAPTOR CABLE SPOOL

(75) Inventors: John Doherty, Austin, TX (US); Jeffrey W. Godsted, Round Rock, TX (US); Leo Quintero, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 10/055,550

(22) Filed: Jan. 23, 2002

(51) Int. Cl.[7] .......................... H02B 1/048; H05K 5/00; H01R 13/72
(52) U.S. Cl. ..................... 361/826; 361/752; 439/501
(58) Field of Search .................... 361/826, 736, 361/752; 174/50; 439/501, 502; 242/400.1; 24/16

(56) References Cited

U.S. PATENT DOCUMENTS

| | | | | |
|---|---|---|---|---|
| 5,071,367 A | * | 12/1991 | Luu | 439/501 |
| 5,720,628 A | * | 2/1998 | Usui et al. | 439/502 |
| D400,175 S | * | 10/1998 | Okamoto | D13/139.7 |
| 5,984,224 A | * | 11/1999 | Yang | 242/400.1 |
| D428,327 S | * | 7/2000 | Stekelenburg | D8/359 |
| 6,164,582 A | * | 12/2000 | Vara | 242/395 |
| 6,331,936 B1 | | 12/2001 | Hom et al. | |
| 6,427,290 B1 | * | 8/2002 | Liu | 24/16 R |
| 6,428,348 B1 | * | 8/2002 | Bean | 439/501 |
| 6,433,274 B1 | * | 8/2002 | Doss et al. | 174/50 |

* cited by examiner

*Primary Examiner*—David Martin
*Assistant Examiner*—Dameon E. Levi
(74) *Attorney, Agent, or Firm*—Haynes and Boone, LLP

(57) ABSTRACT

An electronic device such as an AC adaptor includes a cable spool. A cable connector is provided on a housing for the AC adaptor. A cable extends from the connector. The cable may be wrapped around the housing in a spool-like manner for storing the cable on the housing. The cable is confined in a spool by a pair of spaced-apart guide members which extend from the housing.

15 Claims, 5 Drawing Sheets

AC ADAPTOR CABLE SPOOL

BACKGROUND

The disclosures herein relate generally to cable storage and more particularly to a cable spool for an AC power adaptor.

Electronic devices such as AC adaptors are provided in a housing. The housing includes an AC connector and a DC connector so that both AC and DC cables can be attached to the housing when the adaptor is to be used. The adaptor and the cables must be stored when not in use. Storage of the cables needs to be accomplished in a non-bulky and tangle-free manner.

As AC power adaptors have become smaller and smaller, the size of the AC and DC cables has become a larger portion of the overall travel space required. The cables tend to be very bulky and tangle while stored in carrying cases. A clean way of wrapping both AC and DC cables is needed.

It would be a time saver to be able to wrap the cables around the housing so that the cables do not have to be removed from the housing and coiled separately for storage. Therefore, a cable management device is desirable for AC adaptors. Most AC adaptors have no cable management designed in. Some AC adaptors have cable managers that have folding pieces that tend to break easily. Some AC adaptors have molded-in cable managers that do not have the flexibility to be removed.

Therefore, what is needed is a cable management apparatus and method provided on an electronic device such as an AC adaptor such that a removable cable management device is provided for the adaptor housing.

SUMMARY

One embodiment, accordingly, provides a cable manager on the AC adaptor which can be used as a guide to wrap both the AC and DC cables around the adaptor housing. To this end, an electronic housing has a cable connector therein and a cable spool for a cable. The spool includes spaced apart guide members extending from the housing, whereby a cable is wrapped around the housing between the guide members.

A principal advantage of this embodiment is that it provides for non-bulky cable storage in a tangle-free manner.

DETAILED DESCRIPTION

Figure 1A:
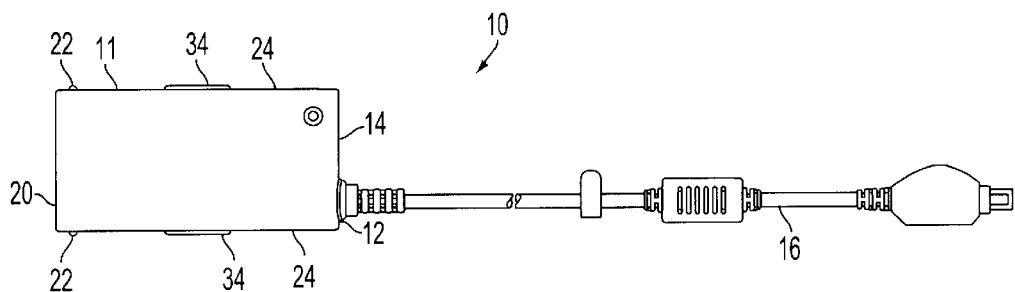
FIGS. 1a, 1b and 1c are top, side and end views, respectively, illustrating an embodiment of an AC adaptor housing.
Figure 1B:
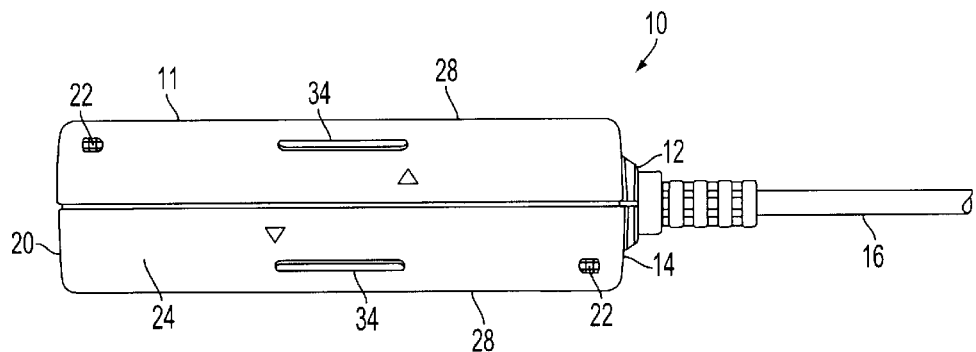
Figure 1C:
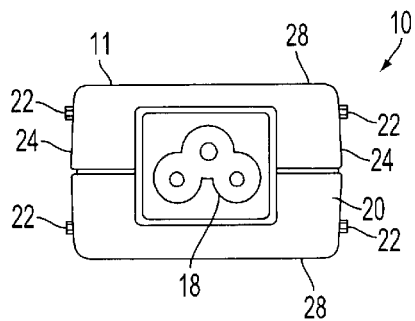

An electronic device which may include an AC adaptor 10, FIGS. 1a, 1b, 1c, includes a housing 11 which has a cable connector 12 at one end 14 thereof. An AC cable 16 extends from the connector 12. A DC connector 18 is provided at an opposite end 20 of housing 11, for connection with a DC cable (not shown).

A cable spool may be provided on housing 11 for wrapping and confining AC cable 16 (and possibly a DC cable) around the housing 11 for storage. The cable spool is provided in the form of a pair of spaced apart guide members 26, FIGS. 1a–1c and 2a–2c. Guide members 26 could be a permanent part of the housing 11 but are preferably removably attached to housing 11. The guide members 26 are preferably formed of a molded suitable plastic material.

Advantageously, the guide members 26 are identically formed so that either of the guide members 26 may be attached to either of the opposite sides 28 of housing 11. As such, the guide members 26 form a pair of continuous flanges on the opposite sides 28 of housing 11.

Guide members 26 can be attached to housing 11 in several ways. The guide members 26 could be press fit onto the housing 11. However, it is preferred that the guide members 26 either attach to the housing 11 or attach to each other.

In the embodiment of FIGS. 1a–1c and 2a–2c, for example, a plurality of tangs 22 are provided on opposite surfaces 24 of housing 11. A complimentary plurality of flexible snap tabs 30 are attached to each guide member 26. The snap tabs 30 each include an opening 32 for engagement with a respective one of the tangs 22. Also a plurality of guide rails 34 are provided on housing 11 and a plurality of mating guide rails 36 are provided on each guide member 26. In this manner, each guide member 26 is mounted on a respective side 28 of housing 11. The guide rails 34 are slidably engaged by mating guide rails 36 by movement in a direction E, and the flexible snap tabs 30 snap into engagement with tangs 22. For disengagement, the snap tabs 30 are manually flexed outwardly, i.e. away from housing 11, and the guide members are slidably removed in a direction R.

Figure 3:
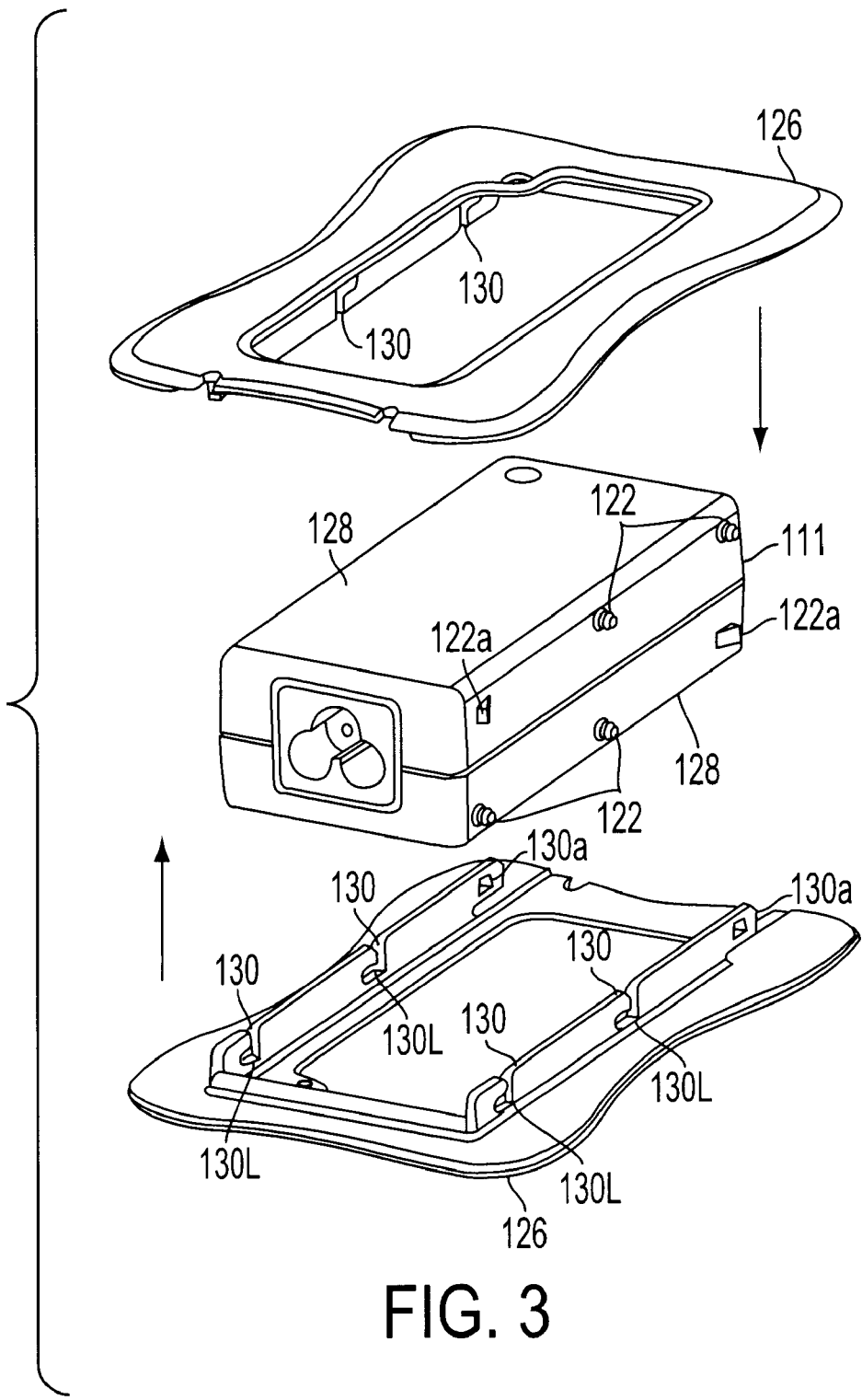
FIG. 3 is an exploded perspective view illustrating an embodiment of an AC adaptor housing.

In the embodiment of FIG. 3, the identical guide members 126 are moved toward opposite sides 128 of housing 111. A plurality of tangs 122 on housing 111 are engaged by a plurality of openings 130 on guide members 126. Once engaged, the guide members 126 are moved to removably engage tangs 122 with L-shaped slots 130L which extend from openings 130. A pair of locking tangs 122a and flexible snap tabs 130a are also provided to secure the guide members 126 on the housing 111. For disengagement, the movement process is reversed. That is, the flexible snap tabs 130a are manually flexed outwardly, i.e. away from housing 111, to disengage tangs 122a, and the guide members 126 are moved to disengage tangs 122 and slots 130L and openings 130.

Figure 4:
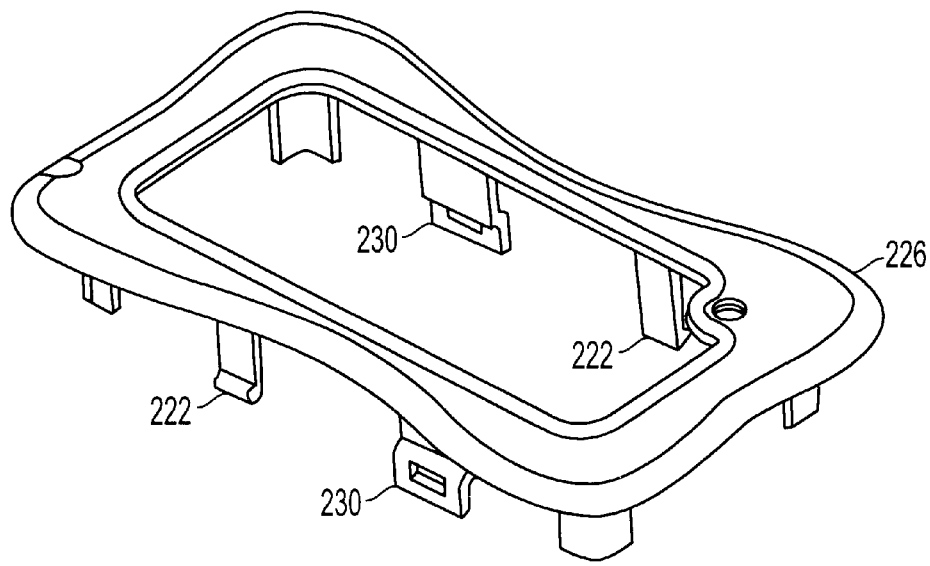
FIG. 4 is a perspective view illustrating an embodiment of a cable guide member.
Figure 5:
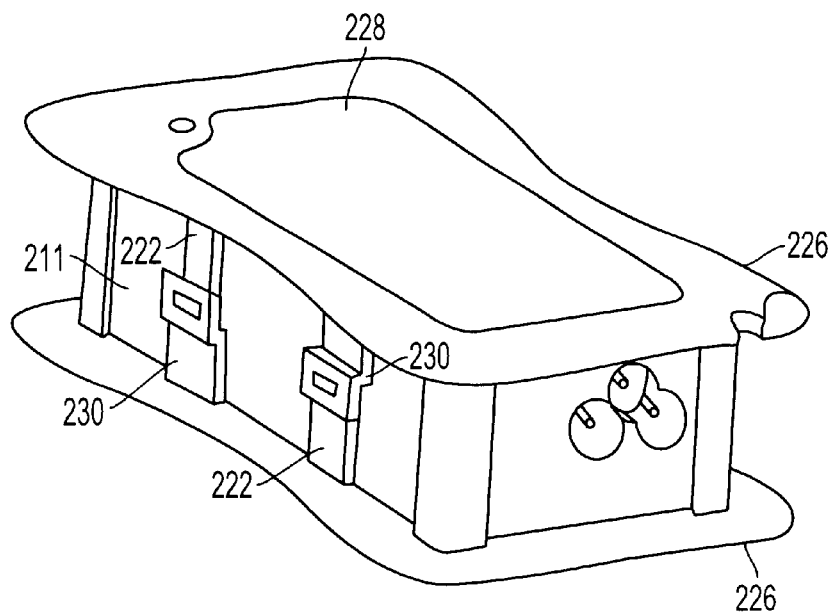
FIG. 5 is a perspective view illustrating an embodiment of an AC adaptor housing.

In the embodiment of FIGS. 4 and 5, each identical guide member 226 includes a plurality of flexible male tangs 222 and a plurality of flexible female snap tabs 230. In this manner, the guide members 226 are mounted on opposite sides 228 of housing 211 and the tangs 222 and snap tabs 230 of one of the guide members 226 are removably engaged with the tangs 222 and snap tabs 230 of the other of the guide members 226. For disengagement, the snap tabs 230 are manually flexed outwardly to disengage.

Figure 2A:
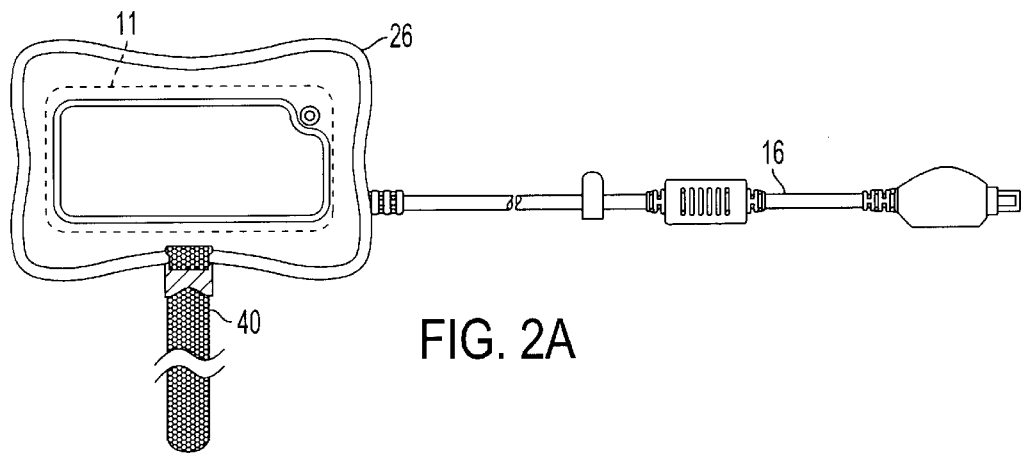
FIGS. 2a, 2b and 2c are top, side and end views, respectively, illustrating an embodiment of an AC adaptor housing.
Figure 2B:
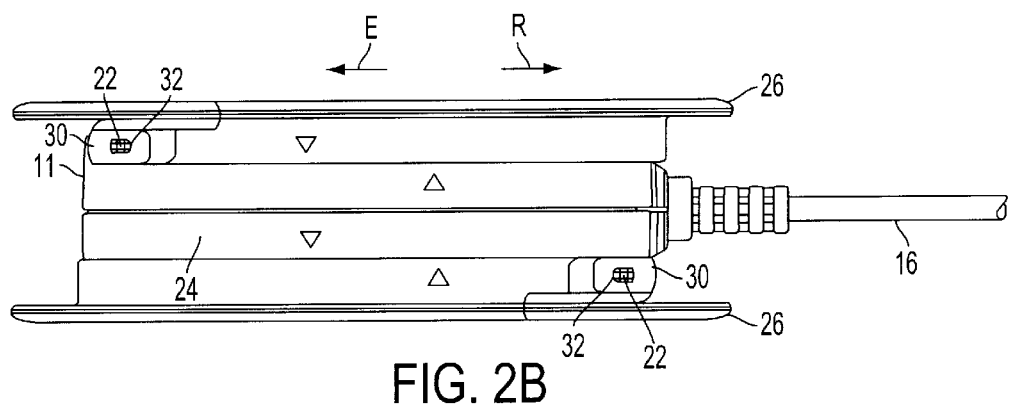
Figure 2C:
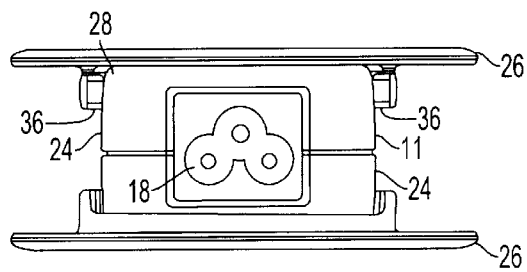
Figure 6:
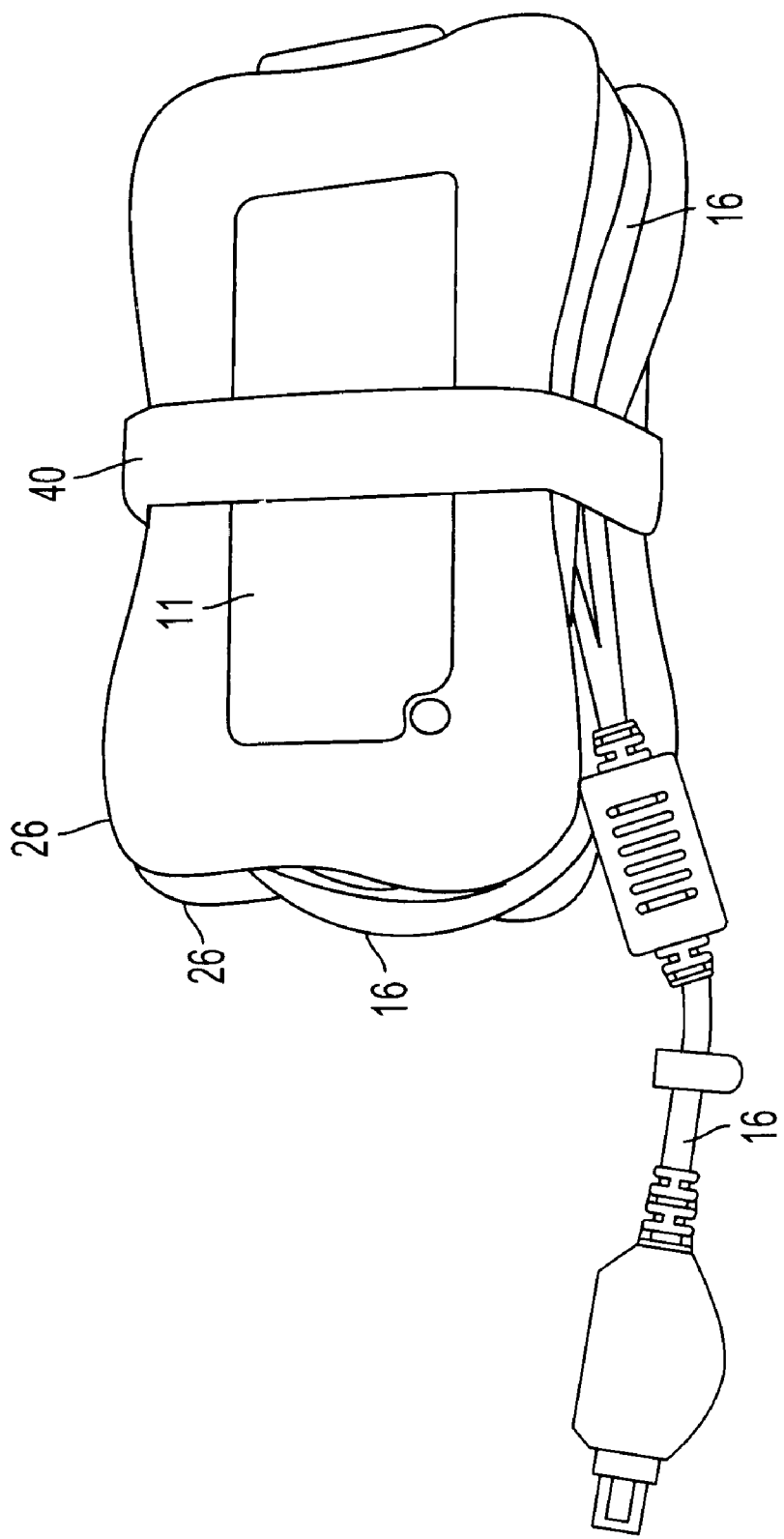
FIG. 6 is a perspective view illustrating an embodiment of an AC adaptor housing.

From the foregoing, it can be seen in FIG. 6, that cable 16 can be wrapped around housing 11 between the guide members 26. In order to secure cable 16 in the wrapped configuration between the guide members 26 as illustrated in FIG. 6, a flexible member 40 is mounted on housing 11. Flexible member 40 can be in the form of an elastic band but preferably, a flexible strap 40, as illustrated in FIG. 2a, is attached to one of the guide members 26. The flexible strap 40 may preferably include an adhesive type material, e.g. Velcro, or a buckle may also be used. The strap 40 may be wrapped around the housing 11 and both guide members 26 to secure the wrapped cable 16 from becoming unwrapped.

Advantageously, the present invention provides a plastic cable manager that can snap in place on to the AC adaptor housing and can be used as a guide to wrap both the AC and DC cables. The plastic cable manager includes two identical parts to minimize cost. One of the plastic parts has a Velcro strap attached to it to secure the cables once they are wrapped. The cable manager is user removable to allow for maximum flexibility if the user wants to store the cables in a different fashion.

Although illustrative embodiments have been shown and described, a wide range of modification, change and substitution is contemplated in the foregoing disclosure and in some instances, some features of the embodiment may be employed without a corresponding use of other features. Accordingly, it is appropriate that the appended claims be construed broadly and in a manner consistent with the scope of the embodiments disclosed herein.

What is claimed is:

1. An electronic device comprising:

a stacked assembly forming a cable spool, the stacked assembly including a middle member between a pair of guide members;

the guide members including a first cable guide member and a second cable guide member interchangeable with and identical to the first cable guide member;

the middle member being an electronic device housing having a cable connector therein and a pair of opposed surfaces; and either one of the first and second cable guide members being removably attached to either one of the opposed surfaces of the housing, and the other one of the first and second cable guide members being attached to the other one of the opposed surfaces of the housing, whereby a cable is wrapped around the housing between the guide members.

2. The device as defined in claim 1 wherein the housing is for an AC adaptor and includes multiple cable connectors therein.

3. The device as defined in claim 1 wherein the guide members snap on the housing.

4. The device as defined in claim 1 wherein the guide members form a pair of continuous flanges on opposite sides of the housing.

5. The device as defined in claim 1 wherein one of the guide members attaches to the other of the guide members.

6. An AC adaptor comprising:

a stacked assembly forming a cable spool, the stacked assembly including a middle member between a pair of guide members;

the guide members including a first cable guide member and a second cable guide member interchangeable with and identical to the first cable guide member;

the middle member being an AC adaptor housing having a cable connector therein and a pair of opposed surfaces; and either one of the first and second cable guide members being removably attached to either one of the opposed surfaces of the housing, and the other one of the first and second cable guide members being attached to the other one of the opposed surfaces of the housing.

7. The adaptor as defined in claim 6 wherein the housing includes multiple cable connectors thereon.

8. The adaptor as defined in claim 6 wherein the guide members snap on the housing.

9. The adaptor as defined in claim 6 wherein the guide members form a pair of continuous flanges on opposite sides of the housing.

10. The adaptor as defined in claim 6 wherein one of the guide members attaches to the other of the guide members.

11. The adaptor as defined in claim 6 further comprising:

a flexible strap attached to one of the guide members for retaining the adaptor cable between the guide members.

12. An electronic device comprising:

a stacked assembly forming a cable spool, the stacked assembly including a middle member between a pair of guide members;

the guide members including a first cable guide member and a second cable guide member interchangeable with and identical to the first cable guide member;

the middle member being an electronic device housing having a cable connector therein and a pair of opposed surfaces;

an elongated cable attached to the housing; and either one of the first and second cable guide members being removably attached to either one of the opposed surfaces of the housing, and the other one of the first and second cable guide members being attached to the other one of the opposed surfaces of the housing.

13. The device as defined in claim 12 wherein the guide members form a pair of continuous flanges on opposite sides of the housing.

14. The device as defined in claim 13 wherein the cable is wrapped around the housing and between the flanges.

15. The device as defined in claim 14 further comprising:

a flexible member mounted on the housing and the guide members for retaining the wrapped cable between the flanges.

* * * * *